(12) United States Patent
Nakajima et al.

(10) Patent No.: US 12,345,576 B2
(45) Date of Patent: Jul. 1, 2025

(54) CONDUCTIVE FILM, METHOD FOR MANUFACTURING CONDUCTIVE FILM, AND TEMPERATURE SENSOR FILM

(71) Applicant: NITTO DENKO CORPORATION, Ibaraki (JP)

(72) Inventors: Kazuhiro Nakajima, Ibaraki (JP); Tomotake Nashiki, Ibaraki (JP); Kodai Miyamoto, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 524 days.

(21) Appl. No.: 17/765,522

(22) PCT Filed: Sep. 16, 2020

(86) PCT No.: PCT/JP2020/035028
§ 371 (c)(1),
(2) Date: Mar. 31, 2022

(87) PCT Pub. No.: WO2021/065505
PCT Pub. Date: Apr. 8, 2021

(65) Prior Publication Data
US 2022/0404213 A1    Dec. 22, 2022

(30) Foreign Application Priority Data

Oct. 1, 2019   (JP) .................. 2019-181493

(51) Int. Cl.
*G01K 7/18*        (2006.01)
*G01K 7/16*        (2006.01)
(Continued)

(52) U.S. Cl.
CPC ............... *G01K 7/183* (2013.01); *G01K 7/16* (2013.01); *G01K 7/18* (2013.01); *H01B 5/14* (2013.01);
(Continued)

(58) Field of Classification Search
CPC ............ G01K 7/183; G01K 7/16; G01K 7/18; G01K 2007/163; G01K 2217/00;
(Continued)

(56) References Cited

U.S. PATENT DOCUMENTS 3,660,158 A * 5/1972 Chen .................. H01C 7/02
                                                29/613
9,860,981 B2 * 1/2018 Tanaka ................. C08J 7/042
(Continued)

FOREIGN PATENT DOCUMENTS

CN          104169699 A      11/2014
CN          208818369 U       5/2019
(Continued)

OTHER PUBLICATIONS

Extended (Supplementary) European Search Report dated Sep. 15, 2023, issued in counterpart EP Application No. 20872137.3. (10 pages).

(Continued)

*Primary Examiner* — Nathaniel T Woodward
*Assistant Examiner* — Philip L Cotey
(74) *Attorney, Agent, or Firm* — WHDA, LLP (57) ABSTRACT

A conductive film (102) includes: a resin film base (50) having a hard coat layer (6) on one main surface of a resin film (5); an underlying layer (20) on a hard coat layer-formed surface of the resin film base; and a metal thin film (10) on the underlying layer. The underlying layer includes at least one layer of inorganic dielectric thin film. The hard coat layer contains first fine particles having an average primary particle diameter of 10 to 100 nm. In a cross section of the hard coat layer, the proportion of an area occupied by the first fine particles is preferably 10% or more.

11 Claims, 2 Drawing Sheets

(51) Int. Cl.
  *H01B 5/14* (2006.01)
  *C23C 14/08* (2006.01)
  *C23C 14/10* (2006.01)
  *C23C 14/20* (2006.01)
  *H01B 13/00* (2006.01)

(52) U.S. Cl.
  CPC .............. *C23C 14/08* (2013.01); *C23C 14/10* (2013.01); *C23C 14/205* (2013.01); *G01K 2007/163* (2013.01); *G01K 2217/00* (2013.01); *H01B 13/0036* (2013.01)

(58) Field of Classification Search
  CPC ...... H01B 5/14; H01B 13/0036; C23C 14/08; C23C 14/10; C23C 14/205
  See application file for complete search history.

(56) References Cited

U.S. PATENT DOCUMENTS

| | | | | |
|---|---|---|---|---|
| 2009/0315849 | A1* | 12/2009 | Ito | C08J 7/0423 345/173 |
| 2013/0113757 | A1* | 5/2013 | Tanaka | H05K 3/0064 156/60 |
| 2014/0370275 | A1* | 12/2014 | Kuchiyama | H10K 50/828 204/192.15 |
| 2015/0071326 | A1 | 3/2015 | Nagatomo et al. | |
| 2015/0302951 | A1* | 10/2015 | Jung | G06F 3/0412 428/216 |
| 2016/0122599 | A1* | 5/2016 | Kim | C09J 7/10 428/354 |
| 2019/0227195 | A1* | 7/2019 | Horio | G02B 5/22 |
| 2020/0148911 | A1* | 5/2020 | Byun | C09D 4/00 |

FOREIGN PATENT DOCUMENTS

| | | |
|---|---|---|
| EP | 3486693 A1 | 5/2019 |
| JP | H107-333073 A | 12/1995 |
| JP | 2005-091045 A | 4/2005 |
| JP | 2017-024267 A | 2/2017 |
| JP | 2019-001002 A | 1/2019 |
| WO | 2019/054806 A1 | 3/2019 |
| WO | 2019/107036 A1 | 6/2019 |

OTHER PUBLICATIONS

Office Action dated Mar. 4, 2024, issued in counterpart TW Application No. 109133332, with English translation. (17 pages).
International Search Report dated Nov. 10, 2020, issued in counterpart International application No. PCT/JP2020/035028. (2 pages).
Notification of Transmittal of Translation of the International Preliminary Report on Patentability (Form PCT/IB/338) issued in counterpart International Application No. PCT/JP2020/035028 mailed Apr. 14, 2022, with Forms PCT/IB/373 and PCT/ISA/237. (7 pages).
Office Action dated Apr. 25, 2025, issued in counterpart CN Application No. 202080069055.1, with English translation. (15 pages).

* cited by examiner

CONDUCTIVE FILM, METHOD FOR MANUFACTURING CONDUCTIVE FILM, AND TEMPERATURE SENSOR FILM

TECHNICAL FIELD

The present invention relates to a temperature sensor film including a patterned metal thin-film formed on a film base, an electroconductive film used in production of the temperature sensor film, and a method for producing the same.

BACKGROUND ART

A large number of temperature sensors are used in electronic devices. As the temperature sensor, a thermocouple or a chip thermistor is generally used. In a case where temperatures at a plurality of locations in one plane are measured by a thermocouple, a chip thermistor, or the like, it is required to arrange the temperature sensor at each measurement point and connect the respective temperature sensors to a printed wiring board or the like, resulting in a complicated production process. In addition, in order to measure an in-plane temperature distribution, it is required to arrange a large number of sensors on a substrate, which causes an increase in cost.

Patent Document 1 proposes a temperature sensor film in which a metal film is disposed on a film base, and the metal film is patterned to form a thermometric resistor part and a lead part. In the form of patterning the metal film, the thermometric resistor part and the lead part connected to the thermometric resistor part can be formed from one layer of the metal film, and it is not required to connect individual thermometric sensors by wiring. In addition, since the film base is employed, the temperature sensor film is excellent in flexibility and thus is easy to adoption in curved surface shape devices, flexible devices, and the like.

In the temperature sensor in which the metal film is patterned, the temperature is measured by applying a voltage to the thermometric resistor part through the lead part and using a characteristic that a resistance value of the metal varies depending on the temperature. In order to increase temperature measurement accuracy, a material having a large change in resistance with respect to a change in temperature is preferable. Patent Document 2 discloses that nickel is about twice as sensitive to the temperature (change in resistance) as copper.

PRIOR ART DOCUMENTS

Patent Documents

Patent Document 1: JP 2005-91045 A
Patent Document 2: JP H7-333073 A

SUMMARY OF THE INVENTION

Problems to be Solved by the Invention

A temperature sensor film can be obtained by producing an electroconductive film having a metal thin-film disposed on a resin film base and patterning the metal thin-film. In a case where a resin film base is used, a metal thin-film having uniform thickness and characteristics can be formed on a long (for example, about 10 m to 10,000 m) resin film base by adopting a continuous deposition method such as roll-to-roll sputtering.

In a case where the electroconductive film is formed by a roll-to-roll process, it is required that the metal thin-film is less likely to be scratched due to rubbing or the like during roll conveyance (scratch resistance is required). In addition, it is required that the metal thin-film is hardly cracked when the film is bent during roll conveyance or device assembly (bending resistance is required).

Through studies conducted by the present inventors, it has been found that an electroconductive film having a metal thin-film disposed on a resin film base does not have sufficient scratch resistance and bending resistance of the metal thin-film, and has scratches or cracks on the metal thin-film during a production process of the electroconductive film, patterning of the metal thin-film, and assembly into a device, which may cause defects such as disconnection.

As a result of further studies in view of this point, it has been found that the scratch resistance of the metal thin-film is improved by disposing a hard coat layer on a surface of a resin film and disposing a metal thin-film on the hard coat layer. However, even when the hard coat layer is disposed, the bending resistance is not improved. In addition, it has been found that when a metal thin-film is disposed on the hard coat layer, scratch resistance is improved, but adhesion of the metal thin-film is deteriorated, and the metal thin-film is easily peeled off from the resin film base when exposed to a high temperature environment or a high humidity environment for a long time.

In view of the above problems, an object of the present invention is to provide an electroconductive film including a metal thin-film with a high scratch resistance and bending resistance on a resin film base and having excellent adhesion of the metal thin-film.

MEANS FOR SOLVING THE PROBLEMS

An electroconductive film for a temperature sensor includes an underlying layer disposed on a hard coat layer-equipped surface of a resin film base having a hard coat layer, and a metal thin-film disposed on the underlying layer. The hard coat layer contains first particles (nanoparticles) having an average primary particle diameter of 10 to 100 nm. In a cross section of the hard coat layer, a proportion of an area occupied by the nanoparticles is preferably 10% or more. The hard coat layer may contain second fine particles (microparticles) having an average primary particle diameter of 0.5 to 3.5 μm, in addition to the nanoparticles.

The underlying layer contains at least one layer of inorganic dielectric thin-film, and it is preferable a thin-film disposed directly under the metal thin-film is an inorganic dielectric thin-film. In addition, the underlying layer preferably includes at least one layer of silicon-based thin-film. In one embodiment, the thin-film disposed directly under the metal thin-film is a silicon oxide thin-film.

An arithmetic mean roughness Ra of the metal thin-film is preferably 2 nm or more, and a root mean square roughness Rq of the metal thin-film is preferably 2.5 nm or more. Ra and Rq are determined from a roughness curve having a length of 1 μm. The arithmetic mean roughness Ra of the metal thin-film may be 25 nm or less, and the root mean square roughness Rq of the metal thin-film may be 40 nm or less.

A temperature sensor film can be formed by patterning the metal thin-film of the electroconductive film. The temperature sensor film includes the underlying layer and the patterned metal thin-film formed on one principal surface of the resin film base, and the metal thin-film is patterned into a thermometric resistor part and a lead part. The underlying layer and the metal thin-film may be disposed on both surfaces of the resin film base.

The electroconductive film and the metal thin-film of the temperature sensor film preferably have a temperature coefficient of resistance of 3,000 ppm/° C. or more. A thickness of the metal thin-film is preferably 20 to 500 nm. The metal thin-film may be a nickel-based thin-film formed of nickel or a nickel alloy.

Effects of the Invention

An electroconductive film in which a metal thin-film is disposed on a hard coat layer-formed surface of a resin film base with an underlying layer interposed therebetween, and a temperature sensor film in which the metal thin-film of the electroconductive film is patterned are provided. The electroconductive film and the temperature sensor film have high scratch resistance, bending resistance, and adhesion of the metal thin-film, and are excellent in processability, durability, and reliability.

MODE FOR CARRYING OUT THE INVENTION

Figure 1:
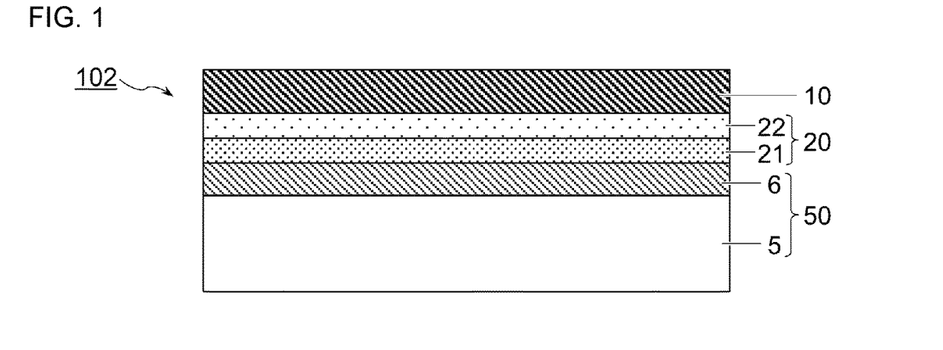
FIG. 1 is a cross-sectional view illustrating an example of a stacking configuration of an electroconductive film.
Figure 2:
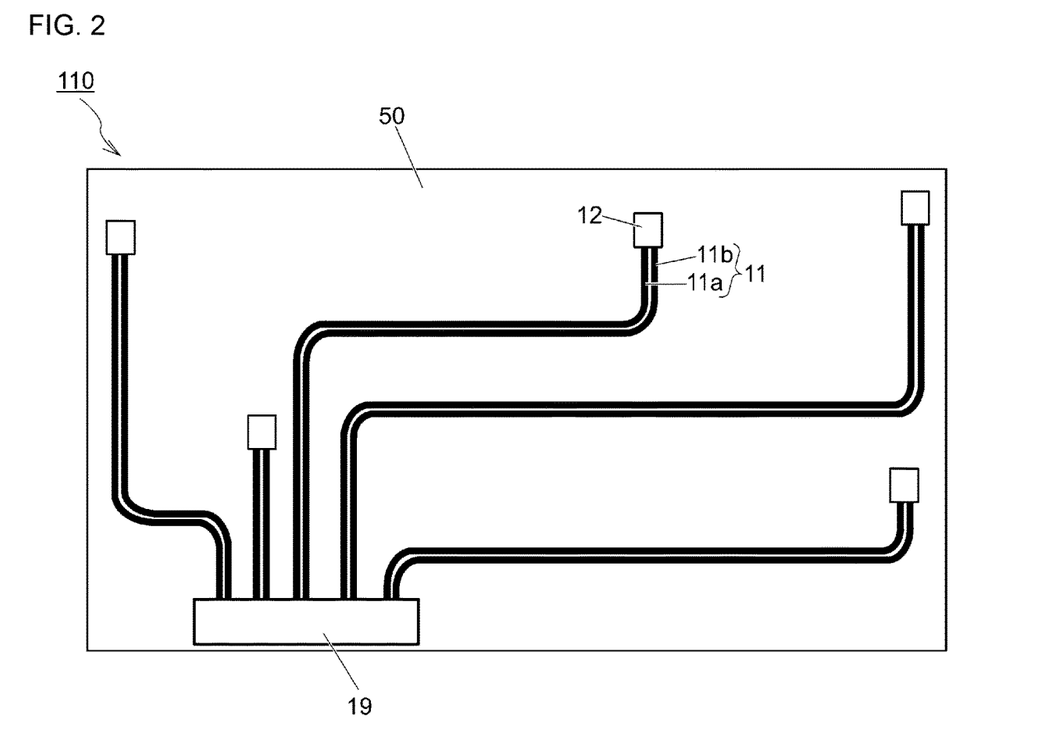
FIG. 2 is a plan view of a temperature sensor film.

FIG. 1 is a cross-sectional view illustrating examples of a stacking configuration of an electroconductive film used for forming a temperature sensor film, in which a metal thin-film 10 is disposed on one principal surface of a resin film base 50, and an underlying layer 20 is disposed between the resin film base 50 and the metal thin-film 10. The metal thin-film of electroconductive film 102 is patterned, such that a temperature sensor film 110 illustrated in a plan view of FIG. 2 is obtained.

[Electroconductive Film]

<Resin Film Base>

The resin film base 50 may be transparent or non-transparent. As illustrated in FIG. 1, the resin film base 50 include a hard coat layer (cured resin layer) 6 formed on a surface of a resin film 5. A thickness of the resin film base 50 is, although not particularly limited, generally about 2 to 500 μm, and preferably about 20 to 300 μm.

An easily adhesive layer, an antistatic layer, and the like may be disposed on a surface of the resin film 5 and/or a surface of the hard coat layer 6. The surface of the resin film 5 and/or the surface of the hard coat layer 6 may be subjected to a treatment such as a corona discharge treatment, an ultraviolet irradiation treatment, a plasma treatment, or a sputter etching treatment in order to increase adhesion.

(Resin Film)

Examples of a resin material of the resin film 5 include polyester such as polyethylene terephthalate, polyimide, polyolefin, cyclic polyolefin such as norbornene, polycarbonate, polyether sulfone, and polyarylate. Polyimide or polyester is preferable from the viewpoint of heat resistance, dimensional stability, electrical properties, mechanical properties, chemical resistance, and the like. A thickness of the resin film 5 is, although not particularly limited, generally about 2 to 500 μm, and preferably about 20 to 300 μm.

(Hard Coat Layer)

When a hard coat layer 6 is disposed on the surface of the resin film 5, hardness of the electroconductive film is improved so that scratch resistance is improved. The hard coat layer 6 can be formed, for example, by applying a solution containing a curable resin onto the resin film 5.

Examples of the curable resin include a thermosetting resin, an ultraviolet curable resin, and an electron beam curable resin. Examples of the type of curable resin include various resins such as polyester-based, acrylic, urethane-based, acrylic urethane-based, amide-based, silicone-based, silicate-based, epoxy-based, melamine-based, oxetane-based, and acrylic urethane-based resins.

Among them, an acrylic resin, an acrylic urethane-based resin, and an epoxy-based resin are preferable because these resins have high hardness, can be cured by ultraviolet rays, and have excellent productivity. The ultraviolet curable resin encompasses ultraviolet curable monomer, oligomer, polymer, etc. Examples of the ultraviolet curable resin preferably used include resins having an ultraviolet polymerizable functional group, and among them, a resin containing, as a component, an acrylic monomer or oligomer having 2 or more, in particular, 3 to 6 ultraviolet polymerizable functional groups can be exemplified.

The hard coat layer 6 contains fine particles having an average primary particle diameter of 10 to 100 nm (hereinafter, may be referred to as "nanoparticles"), in addition to the resin component. The hard coat layer 6 contains the nanoparticles, such that fine irregularities tend to be formed on the surface of the resin film base 50, and adhesion between the hard coat layer 6 to the underlying layer 20 and the metal thin-film 10 and bending resistance of the metal thin-film tend to be improved. The average primary particle diameter of the nanoparticles may be 20 nm or more from the viewpoint of increasing dispersibility. The average primary particle diameter of the nanoparticles is preferably 90 nm or less, more preferably 70 nm or less, and still more preferably 50 nm or less, from the viewpoint of forming fine irregularities contributing to improvement of adhesion to the underlying layer 20.

In a cross section of the hard coat layer, a proportion of an area occupied by the nanoparticles is preferably 10% or more. In the cross section of the hard coat layer, the proportion of the area occupied by the nanoparticles may be 15% or more or 20% or more. The proportion of the area occupied by the nanoparticles is determined by analyzing a transmission electron microscope (TEM) observation image of the cross section of the hard coat layer.

As the proportion of the nanoparticles is larger, irregularities tend to be uniformly formed on the entire surface of the hard coat layer, and the adhesion between the underlying layer 20 and the metal thin-film 10 and the bending resistance of the metal thin-film 10 tend to be improved. On the other hand, in a case where the proportion of the nanoparticles is excessively large, surface irregularities may be coarsened due to aggregation of the particles. In addition, crystallization of the metal thin-film 10 may be inhibited due to the surface irregularities, and the temperature coefficient of resistance (TCR) may be decreased. Therefore, in the cross section of the hard coat layer, the proportion of the area occupied by the nanoparticles is preferably 50% or less and more preferably 45% or less. In the cross section of the hard coat layer, the proportion of the area occupied by the nanoparticles may be 40% or less, 35% or less, or 30% or less.

In order to set the amount of nanoparticles in the hard coat layer within the above range, the amount of nanoparticles in the composition for forming a hard coat layer may be adjusted. The amount of nanoparticles is preferably 10 to 50 parts by weight with respect to 100 parts by weight of the resin component. The amount of nanoparticles may be 45 parts by weight or less, 40 parts by weight or less, 35 parts by weight or less, or 30 parts by weight or less, with respect to 100 parts by weight of the resin component.

As the nanoparticles, various metal oxide fine particles such as silica, alumina, titania, zirconia, calcium oxide, tin oxide, indium oxide, cadmium oxide, and antimony oxide, glass fine particles, crosslinked or uncrosslinked organic fine particles formed of polymers such as polymethyl methacrylate, polystyrene, polyurethane, an acrylic-styrene copolymer, benzoguanamine, melamine, and polycarbonate, silicone-based fine particles, and the like can be used without particular limitation. From the viewpoint of the excellent effect of improving dispersibility in a resin binder and adhesion to the inorganic material constituting the underlying layer 20, the nanoparticles are preferably inorganic particles, and among them, metal oxide particles are preferable, and silica or alumina is particularly preferable.

The hard coat layer 6 may contain, in addition to the nanoparticles, second particles having a particle diameter larger than that of the nanoparticles. An average primary particle diameter of the second particles may be, for example, 0.5 to 10 μm or 0.8 to 5 μm. When the hard coat layer contains fine particles having an average particle diameter in the order of submicron or micrometer (hereinafter, may be referred to as "microparticles"), protrusions with diameters in the order of submicron or micrometer are formed on the surface of the hard coat layer 6 (the surface of the resin film base 50) and the surface of thin-film disposed on the hard coat layer 6, so that slipperiness and blocking resistance of the electroconductive film tend to be improved. From the viewpoint of uniformly forming protrusions on the entire surface of the hard coat layer and improving slipperiness and blocking resistance, the amount of microparticles in the hard coat layer is preferably 0.05 to 20 parts by weight, and more preferably 0.1 to 10 parts by weight, with respect to 100 parts by weight of the resin component.

A solution for forming a hard coat layer preferably contains an ultraviolet polymerization initiator. Additives such as a leveling agent, a thixotropic agent, and an antistatic agent may be contained in the solution.

A thickness of the hard coat layer 6 is, although not particularly limited, preferably 0.5 μm or more, more preferably 0.8 μm or more, and still more preferably 1 μm or more, in order to realize high hardness. In consideration of ease of formation by application, the thickness of the hard coat layer is preferably 15 μm or less and more preferably 10 pin or less.

In a case where microparticles are contained in the hard coat layer, the thickness of the hard coat layer is equal to or less than the average primary particle diameter of the microparticles, protrusions are likely formed on the surface of the hard coat layer, which is advantageous for improving slipperiness, blocking resistance, and scratch resistance. On the other hand, in a case where the thickness of the hard coat layer is excessively smaller than the thickness of the microparticles, the fine particles fall off from the hard coat layer, which may cause deterioration of slipperiness, blocking resistance, and scratch resistance. The thickness of the hard coat layer is preferably 0.5 to 1 time and more preferably 0.6 to 0.9 times the average primary particle diameter of the microparticles.

An arithmetic mean roughness Ra of the hard coat layer 6 is preferably 2 nm or more. Ra may be 2.5 nm or more or 3 nm or more. A root mean square roughness Rq of the hard coat layer 6 is preferably 2.5 nm or more. Rq may be 3 nm or more, 3.5 nm or more, 4 nm or more, 4.5 nm or more, or 5 nm or more. Ra and Rq tend to be increased as the amount of nanoparticles contained in the hard coat layer 6 is larger.

The arithmetic mean roughness Ra and the root mean square roughness Rq are calculated in accordance with JIS B0601:2013 by deriving a roughness curve having a length of 1 μm from a 1 μm square image observed using a scanning probe microscope. As the surface roughnesses Ra and Rq of the hard coat layer are larger, the adhesion of the thin-film (the underlying layer 20 and the metal thin-film 10) formed on the hard coat layer and bending resistance of the metal thin-film tend to be improved.

On the other hand, when the surface roughness of the hard coat layer is excessively large, crystallization of the metal thin-film is inhibited due to the surface irregularities, and the TCR may be decreased. Therefore, the arithmetic mean roughness Ra of the hard coat layer 6 is preferably 25 nm or less, and the root mean square roughness Rq of the hard coat layer 6 is preferably 40 nm or less. Ra may be 20 nm or less, 15 nm or less, 12 nm or less, or 10 nm or less. Rq may be 35 nm or less, 30 nm or less, 25 nm or less, 20 nm or less, or 15 nm or less.

<Underlying Layer>

The electroconductive film 102 includes the underlying layer 20 arranged between the hard coat layer 6 of the resin film base 50 and the metal thin-film 10. The underlying layer 20 may be a single layer, and may have a stack of two or more thin-films, as illustrated in FIG. 1. The underlying layer 20 may be an organic layer or an inorganic layer, and may be a layer in which an organic layer and an inorganic layer are stacked. It is preferable at least one layer of the underlying layer 20 is an inorganic thin-film, and in particular, the thin-film 22 disposed immediately under the metal thin-film 10 is preferably an inorganic thin-film. By providing the inorganic thin-film as the underlying layer 20, mixing of an organic gas into the metal thin-film 10 from the resin film base 50 tends to be suppressed during formation of the metal thin-film 10, the temperature coefficient of resistance (TCR) of the metal thin-film 10 tends to be increased, and the temperature measurement accuracy in the temperature sensor film is improved.

The underlying layer 20 may be electroconductive or insulative. In a case where the thin-film 22 disposed immediately under the metal thin-film 10 is an electroconductive inorganic material (inorganic conductor), the thin-film 21 (or the entire underlying layer 20) may be patterned together with the metal thin-film 10 at the time of producing a temperature sensor film. In a case where the thin-film 21 is an insulating inorganic material (inorganic dielectric), the thin-film 21 may be patterned or may not be patterned.

Examples of the inorganic material include metal elements or semimetal elements such as Si, Ge, Sn, Pb, Al, Ga, In, Tl, As, Sb, Bi, Se, Te, Mg, Ca, Sr, Ba, Sc, Y, Ti, Zr, Hf, V, Nb, Ta, Cr, Mo, W, Mn, Tc, Re, Fe, Ru, Os, Ni, Co, Rh, Ir, Pd, Pt, Cu, Ag, Au, Zn, and Cd, and alloys, nitrides, oxides, carbides, and nitrogen oxides thereof. Since adhesion to both the organic material constituting the hard coat layer 6 and the metal material constituting the metal thin-film 10, such as nickel, is excellent, and the effect of suppressing mixing of impurities into the metal thin-film is high, a silicon-based material or chromium oxide is preferable as the material of the underlying layer.

Examples of the silicon-based material include silicon and silicon compounds such as silicon oxide, silicon nitride, silicon oxynitride, and silicon carbide. Among them, silicon or silicon oxide is preferable because it is excellent in adhesion to the hard coat layer and the metal thin-film and is excellent in an effect of improving bending resistance. From the viewpoint of securing insulation between wirings when the metal thin-film 10 is patterned, the layer 22 disposed immediately under the metal thin-film 10 is preferably an inorganic dielectric thin-film such as silicon oxide.

By disposing a thin-film 22 having a high specific resistance, such as silicon oxide thin-film, immediately under the metal thin-film 10, a leakage current between wirings (patterned metal thin-film) tends to be reduced, and the temperature measurement accuracy of the temperature sensor film tends to be improved. Silicon oxide may be a stoichiometric composition ($SiO_2$) or may be a non-stoichiometric composition ($SiO_x$, x<2). In a non-stoichiometric silicon oxide ($SiO_x$), it is preferable $1.2 \leq x < 2$ is satisfied.

As the underlying layer 20, the silicon oxide thin-film 22 may be formed on the silicon thin-film 21. In addition, the underlying layer 20 having a configuration in which the chromium oxide thin-film 21 and the silicon oxide thin-film 22 are stacked is also preferable from the viewpoint of improving adhesion and bending resistance and improving the TCR.

A thickness of the underlying layer 20 and a thickness of the thin-film constituting the underlying layer 20 are not particularly limited. The thickness of the underlying layer 20 is preferably 1 nm or more, more preferably 3 nm or more, and still more preferably 5 nm or more, from the viewpoint of improving bending resistance by an underlying effect for the metal thin-film 10, and from the viewpoint of reducing plasma damage to the resin film base and enhancing the effect of blocking outgas from the resin film base during the formation of the metal thin-film. The thickness of the underlying layer is preferably 200 nm or less, more preferably 100 nm or less, and still more preferably 50 nm or less, from the viewpoint of improving productivity and reducing material costs.

<Metal Thin-Film>

The metal thin-film 10 disposed on the underlying layer 20 plays a central role in the temperature measurement in the temperature sensor. By patterning the metal thin-film 10, a lead part 11 and a thermometric resistor part 12 are formed as illustrated in FIG. 2. By disposing the metal thin-film 10 on the hard coat layer 6 containing nanoparticles with the underlying layer 20 interposed therebetween, the scratch resistance tends to be improved and the bending resistance tends to be improved without deteriorating the adhesion.

Examples of the metal material constituting the metal thin-film 10 include copper, silver, aluminum, gold, rhodium, tungsten, molybdenum, zinc, tin, cobalt, indium, nickel, iron, platinum, palladium, tin, antimony, bismuth, magnesium, and an alloy thereof. Among them, nickel, copper, or an alloy containing them as a main component (containing 50 wt % or more) is preferable, and nickel or a nickel alloy containing nickel as a main component is particularly preferable, in terms of low resistance, a high TCR, and an inexpensive material.

The thickness of the metal thin-film 10 is, although not particularly limited, preferably 20 nm or more, more preferably 40 nm or more, and still more preferably 50 nm or more, from the viewpoint of low resistance (in particular, from the viewpoint of reducing resistance of the lead part). On the other hand, from the viewpoint of shortening the deposition time, improving the patterning accuracy, and the like, the thickness of the metal thin-film 10 is preferably 500 nm or less, and more preferably 300 nm or less. In general, when the thickness of the metal thin-film is increased, the residual stress tends to be increased, and the adhesion to the resin film base tends to be deteriorated. In contrast, even in a case where the thickness of the metal thin-film is increased, the adhesion is improved by disposing the metal thin-film on the hard coat layer containing nanoparticles with the underlying layer interposed therebetween, such that peeling of the metal thin-film from the resin film base can be suppressed.

In a case where the metal thin-film 10 is a nickel thin-film or a nickel alloy thin-film, a specific resistance at a temperature of 25° C. is preferably $1.6 \times 10^{-5}$ Ω·cm or less and more preferably $1.5 \times 10^{-5}$ Ω·cm or less. From the viewpoint of reducing the resistance of the lead part, the specific resistance of the metal thin-film is preferably as small as possible and may be $1.2 \times 10^{-5}$ Ω·cm or less or $1.0 \times 10^{-5}$ Ω·cm or less. The specific resistance of the metal thin-film is preferably as small as possible, but it is difficult to make the specific resistance smaller than that of bulk nickel, and the specific resistance is generally $7.0 \times 10^{-6}$ Ω·cm or more.

The TCR of the metal thin-film 10 is preferably 3,000 ppm/° C. or more, more preferably 3,400 ppm/° C. or more, still more preferably 3,600 ppm/° C. or more, and particularly preferably 3,800 ppm/° C. or more. The TCR is a rate of change in resistance with respect to an increase in temperature. A metal such as nickel or copper has a characteristic (positive characteristic) in which the resistance is linearly increased according to the increase in temperature. The TCR of the material having the positive characteristic is calculated from a resistance value $R_0$ at a temperature $T_0$ and a resistance value $R_1$ at a temperature $T_1$ by the following equation.

$$TCR = \{(R_1 - R_0)/R_0\}/(T_1 - T_0)$$

In the present specification, an average value of a TCR calculated from the resistance values at $T_0 = 25°$ C. and $T_1 = 5°$ C. and a TCR calculated from the resistance values at $T_0 = 25°$ C. and $T_1 = 45°$ C. is defined as the TCR of the metal thin-film.

As the TCR is larger, the chance in resistance with respect to the change in temperature is increased, and the temperature measurement accuracy in the temperature sensor film is improved. Therefore, the TCR of the metal thin-film is preferably as large as possible, but it is difficult to make the TCR larger than that of a bulk metal, and the TCR of the metal thin-film is generally 6,000 ppm/° C. or less. By providing the underlying layer 20 on the resin film base 50 and forming the metal thin-film 10 on the underlying layer 20, the specific resistance of the metal thin-film tends to be decreased, and the TCR of the metal thin-film tends to be increased.

An arithmetic mean roughness Ra of the metal thin-film 10 is preferably 2 nm or more. Ra may be 2.5 nm or more or 3 nm or more. A root mean square roughness Rq of the metal thin-film 10 is preferably 2.5 nm or more. Rq may be 3 nm or more, 3.5 nm or more, 4 nm or more, 4.5 nm or more, or 5 nm or more. As the surface roughness of the metal thin-film is larger, the adhesion and bending resistance of the metal thin-film tend to be improved. On the other hand, when the surface roughness of the metal thin-film is excessively large, the TCR may be decreased. Therefore, the arithmetic mean roughness Ra of the metal thin-film 10 is preferably 25 nm or less, and the root mean square roughness Rq of the metal thin-film 10 is preferably 40 nm or less. Ra may be 20 nm or less, 15 nm or less, 12 nm or less, or 10 nm or less. Rq may be 35 nm or less, 30 nm or less, 25 nm or less, 20 nm or less, or 15 nm or less.

In a case where the underlying layer 20 and the metal thin-film 10 are formed on the hard coat layer 6 by a dry coating method such as a sputtering method, an irregularity shape reflecting the surface shape of the hard coat layer 6 is easily formed on the surface of the metal thin-film 10. Therefore, the metal thin-film 10 having the Ra and Rq can be formed by adjusting particle diameters and content of the fine particles contained in the hard coat layer 6 so that the Ra and Rq of the hard coat layer 6 are within the above-described ranges.

As described above, by forming the metal thin-film on the hard coat layer containing nanoparticles with the underlying layer interposed therebetween, not only the scratch resistance of the metal thin-film but also the bending resistance and the adhesion tend to be improved, and the TCR tends to be increased. The improvement of the scratch resistance is considered to be caused by the improvement of the surface hardness due to the provision of the hard coat layer.

When a metal thin-film is disposed on a hard coat layer that does not contain nanoparticles or contains a small content of nanoparticles, the adhesion of the metal thin-film tends to be deteriorated as compared with a case where a hard coat layer is not disposed. In contrast, when a thin-film is formed on a hard coat layer containing a specific amount of nanoparticles, the adhesion tends to be improved. This is considered to be due to the anchor effect of fine irregularities formed by the nanoparticles.

In addition, when a thin-film is formed on a hard coat layer containing a specific amount of nanoparticles, not only the adhesion but also the bending resistance of the metal thin-film tends to be improved, and the occurrence of cracks at the time of bending tends to be suppressed. As one of the factors for improving the bending resistance, control of the crystallinity of the metal thin-film is considered. For example, it is presumed that crystallization of the metal thin-film during deposition is appropriately inhibited by forming the metal thin-film on the base on which surface irregularities are appropriately formed, and thus the amorphous portion remains, which contributes to improvement of the bending resistance.

<Method for Forming Underlying Layer and Metal Thin Film>

A method for forming the underlying layer 20 is not particularly limited, and either dry coating or wet coating can be adopted. In a case where the metal thin-film is formed by a sputtering method, it is preferable that the underlying layer 20 is also formed by the sputtering method from the viewpoint of productivity.

A method for foaming the metal thin-film is not particularly limited, and for example, a deposition method such as a sputtering method, a vacuum deposition method, an electron beam deposition method, a chemical vapor deposition method (CVD), a chemical solution deposition method (CBD), or a plating method can be adopted. Among them, a sputtering method is preferable because a thin-film having excellent film thickness uniformity can be formed. By performing deposition while continuously moving the long resin film base in a longitudinal direction using a roll-to-roll sputtering apparatus, productivity of the electroconductive film is increased.

In deposition of the metal thin-film by roll-to-roll sputtering, it is preferable that a roll-shaped film base is loaded in the sputtering apparatus, and then, inside of the sputtering apparatus is exhausted before the start of the sputtering deposition to obtain an atmosphere in which impurities such as an organic gas generated from the film base are removed. By removing the gas in the apparatus and the film base in advance, the amount of moisture, organic gas, or the like mixed into the metal thin-film 10 can be reduced. A degree of vacuum (degree of ultimate vacuum) in the sputtering apparatus before the start of the sputtering deposition is, for example, $1\times10^{-1}$ Pa or less, preferably $5\times10^{-2}$ Pa or less, more preferably $1\times10^{-2}$ Pa or less, and still more preferably $5\times10^{-3}$ Pa or less.

In sputtering deposition of the metal thin-film, a metal target is used, and the deposition is performed while an inert gas such as argon is introduced. For example, in a case where a nickel thin-film is formed as the metal thin-film 10, a metal Ni target is used. In a case where the underlying layer is formed by a sputtering method, a target may be selected according to the material of the underlying layer. For example, a silicon target is used for forming the silicon thin-film. In deposition of the silicon oxide thin-film, silicon oxide target may be used, or silicon oxide may be formed by a reactive sputtering using a silicon target. A metal Cr target or a chromium oxide target is used for forming the chromium oxide thin-film. In a case where a metal target is used for formation of an oxide thin-film, the deposition by reactive sputtering is performed while a reactive gas such as oxygen is introduced into a chamber in addition to an inert gas such as argon. In the reactive sputtering, it is preferable to adjust the amount of oxygen so as to form an intermediate transition region between the metal region and the oxide region.

The sputtering deposition conditions are not particularly limited. In order to suppress mixing of moisture, an organic gas, or the like into the metal thin-film, it is preferable to reduce damage to the resin film base during deposition of the metal thin-film. By disposing the underlying layer 20 on the resin film base 50 and forming the metal thin-film 10 on the underlying layer 20, plasma damage to the resin film base 50 during deposition of the metal thin-film 10 can be suppressed. In addition, by disposing the underlying layer 20, moisture, an organic gas, or the like generated from the resin film base 50 can be blocked, and mixing of moisture, an organic gas, or the like into the metal thin-film 10 can be suppressed.

In addition, generation of moisture or an organic gas from the resin film base can be suppressed by lowering the substrate temperature during deposition and lowering a discharge power density. The substrate temperature in the sputtering deposition of the metal thin-film is preferably 200° C. or lower, more preferably 180° C. or lower, and still more preferably 170° C. or lower. On the other hand, the substrate temperature is preferably −30° C. or higher from the viewpoint of prevention of embrittlement of the resin film base and the like. From the viewpoint of suppressing damage to the resin film base while stabilizing plasma discharge, the discharge power density is preferably 1 to 15 W/cm$^2$ and more preferably 1.5 to 10 W/cm$^2$.

After deposition of the metal thin-film, a heat treatment may be performed. By heating the electroconductive film including the underlying layer and the metal thin-film formed on the resin film base, the crystallinity of the metal thin-film tends to be increased, and the TCR of the metal thin-film tends to be increased. In a case where a heat treatment is performed, a heating temperature is preferably 80° C. or higher, more preferably 100° C. or higher, and still more preferably 120° C. or higher. An upper limit of the heating temperature may be determined in consideration of heat resistance of the resin film base, and is generally 200° C. or lower or 180° C. or lower. In a case where a highly heat-resistant film base such as a polyimide film is used, the heating temperature may be higher than the above range. A heating time is preferably 1 minute or longer, more preferably 5 minutes or longer, and still more preferably 10 minutes or longer. The timing of performing the heat treatment is not particularly limited as long as it is performed after the metal thin-film is formed. For example, the heat treatment may be performed after patterning the metal thin-film.

[Temperature Sensor Film]

A temperature sensor film is formed by patterning the metal thin-film 10 of the electroconductive film. The underlying layer 20 may be patterned or may not be patterned. In a case where the layer formed immediately under the metal thin-film is an insulating material such as silicon oxide, it is not required to pattern the underlying layer 20.

As illustrated in FIG. 2, in the temperature sensor film, the metal thin-film includes a lead part 11 formed in a wiring shape and a thermometric resistor part 12 connected to one end of the lead part 11. The other end of the lead part 11 is connected to a connector 19.

The thermometric resistor part 12 is a region that acts as a temperature sensor, and the temperature measurement is performed by applying a voltage to the thermometric resistor part 12 through the lead part 11 and calculating the temperature from a resistance value thereof. By providing a plurality of thermometric resistor parts in a plane of a temperature sensor film 110, the temperatures at a plurality of locations can be simultaneously measured. For example, in the form illustrated in FIG. 2, the thermometric resistor parts 12 are provided at five locations in the plane.

Figure 3A:
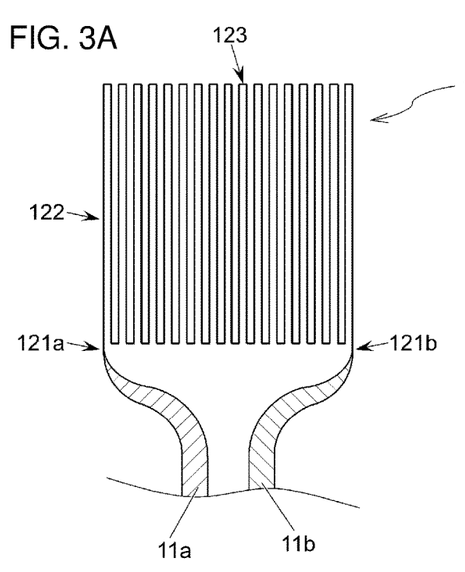
FIGS. 3A and 3B are each enlarged view of the vicinity of a thermometric resistor part in a temperature sensor, wherein FIG. 3A indicates a two-wire type and FIG. 3B indicates a four-wire type.

FIG. 3A is an enlarged view of the vicinity of the thermometric resistor part in a two-wire temperature sensor. The thermometric resistor part 12 is formed by sensor wirings 122 and 123 in which a metal thin-film is patterned into a thin wire shape. In the sensor wiring, a plurality of vertical electrodes 122 are connected at the end thereof through the horizontal wiring 123 to form a hairpin-shaped bent part, thereby having a zigzag pattern.

Figure 3B:
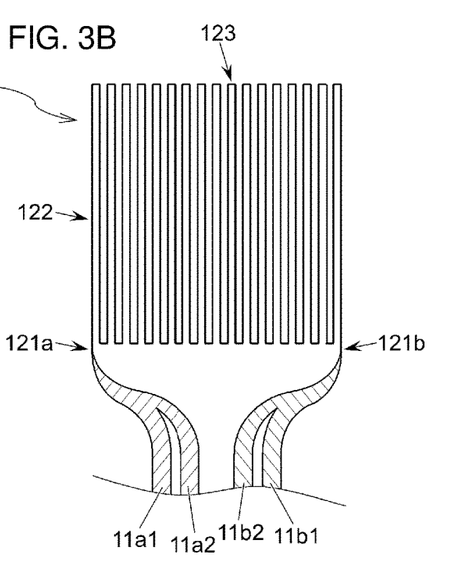

As the wiring width of the thin wire constituting the pattern shape of the thermometric resistor part 12 is smaller (the cross-sectional area is smaller) and the line length from one end 121a to the other end 121b of the sensor wiring of the thermometric resistor part 12 is larger, the resistance between two points is larger, and a resistance change amount is also larger according to the change in temperature. Therefore, the temperature measurement accuracy is improved. By forming the zigzag wiring pattern as illustrated in FIG. 3, the area of the thermometric resistor part 12 can be decreased, and the length of the sensor wiring (line length from one end 121a to the other end 121b) can be increased. The pattern shape of the sensor wiring of the thermometric resistor part is not limited to the form as illustrated in FIG. 3, and may be a pattern shape such as a spiral shape.

The wiring width of the sensor wiring 122 (vertical wiring) and the distance (space width) between adjacent wirings may be set according to the patterning accuracy of photolithography. The wiring width and the space width are generally about 1 to 150 The wiring width is preferably 3 μm or more and preferably 5 μm or more from the viewpoint of preventing disconnection of the sensor wiring. The wiring width is preferably 100 μm or less and more preferably 70 μm or less from the viewpoint of increasing the change in resistance and increasing the temperature measurement accuracy. The space width is preferably 3 to 100 μm and more preferably 5 to 70 μm from the same viewpoints.

Both the ends 121a and 121b of the sensor wiring of the thermometric resistor part 12 are connected to ends of the lead parts 11a and 11b, respectively. Two lead parts 11a and 11b are formed in an elongated pattern in a state of facing each other with a slight gap, and the other end of the lead part is connected to the connector 19. The lead part is formed wider than the sensor wiring of the thermometric resistor part 12 in order to secure a sufficient current capacity. Widths of the lead parts 11a and 11b are, for example, about 0.5 to 10 mm. The wiring width of the lead part is preferably 3 times or more, more preferably 5 times or more, and still more preferably 10 times or more the wiring width of the sensor wiring 122 of the thermometric resistor part 12.

The connector 19 has a plurality of terminals, and a plurality of lead parts are connected to different terminals, respectively. The connector 19 is connected to an external circuit, and a voltage is applied between the lead part 11a and the lead part 11b, such that a current flows through the lead part 11a the thermometric resistor part 12, and the lead part 11b. A resistance value is calculated from a current value when a predetermined voltage is applied, or from an applied voltage when a voltage is applied so that the current becomes a predetermined value. The temperature is calculated from the resistance value based on a relational expression between the obtained resistance value and a temperature obtained in advance, a table in which a relationship between the resistance value and the temperature is recorded, and the like.

The resistance value obtained here includes the resistances of the lead part 11a and the lead part 11b in addition to the resistance of the thermometric resistor part 12. However, since the resistance of the thermometric resistor part 12 is sufficiently larger than the resistances of the lead parts 11a and 11b, the obtained measurement value can be regarded as the resistance of the thermometric resistor part 12. The lead part may be a four-wire type from the viewpoint of reducing the influence by the resistance of the lead part.

FIG. 3B is an enlarged view of the vicinity of the thermometric resistor part in a four-wire temperature sensor. The pattern shape of the thermometric resistor part 12 is identical to that in FIG. 3A. In the four-wire type, four lead parts 11a1, 11a2, 11b1, and 11b2 are connected to one thermometric resistor part 12. The lead parts 11a1 and 11b1 are voltage measurement leads, and the lead parts 11a2 and 11b2 are current measurement leads. The voltage measurement lead 11a1 and the current measurement lead 11a2 are connected to the end 121a of the sensor wiring of the thermometric resistor part 12, and the voltage measurement lead 11b1 and the current measurement lead 11b2 are connected to the other end 121b of the sensor wiring of the thermometric resistor part 12. In the four-wire type, the resistance value of only the thermometric resistor part 12 can be measured by excluding the resistance of the lead part, and thus, measurement with less error can be performed. In addition to the two-wire type and the four-wire type, a three-wire type may be adopted.

A method for pattering the metal thin-film is not particularly limited. Since the patterning is easy and accuracy is high, it is preferable to perform patterning by a photolithography method. In the photolithography, an etching resist corresponding to the shapes of the lead part and the thermometric resistor part are formed on the surface of the metal thin-film, the metal thin-film in a region in which the etching resist is not formed is removed by wet etching, and then, the etching resist is peeled off. The patterning of the metal thin-film can also be performed by dry etching such as laser processing.

In the above embodiment, the underlying layer 20 is disposed on the hard coat layer 6 of the resin film base 50, the metal thin-film 10 is formed by a sputtering method or the like, and the metal thin-film is patterned, such that a plurality of each of lead parts and thermometric resistor parts can be formed in the plane of the substrate. A temperature sensor element is obtained by connecting the connector 19 to the end of the lead part 11 of the temperature sensor film. In this embodiment, the lead parts are connected to the plurality of thermometric resistor parts, and the plurality of lead parts may be connected to one connector 19. Therefore, it is possible to easily form a temperature sensor element capable of measuring temperatures at a plurality of locations in the plane.

Although, in the embodiment described above, the hard coat layer is disposed on one principal surface of the resin film base and the underlying layer and the metal thin-film are formed on the hard coat layer, the hard coat layer may be disposed on both surfaces of the resin film base and the underlying layer and the metal thin-film may be disposed on the principal surfaces thereof, respectively. In addition, the underlying layer and the metal thin-film may be disposed on the hard coat layer formed on one principal surface of the resin film base, and the thin-film having a different stacking configuration may be disposed on the other principal surface.

A method for connecting the lead part of the temperature sensor film and the external circuit is not limited to the connection through the connector. For example, a controller for applying a voltage to the lead part and measuring the resistance may be provided on the temperature sensor film. In addition, the lead part and the lead wiring from the external circuit may be connected by soldering or the like without through the connector.

The temperature sensor film has a simple configuration in which a thin-film is disposed on a resin film base, and thus has excellent productivity. Besides, since the temperature sensor film has a high bending resistance and thus is easy to be processed and handled, it is applicable to curved surface shape devices and flexible devices having a bendable portion. In addition, since the TCR of the metal thin-film is large, more accurate temperature measurement can be realized. Furthermore, in the embodiment of the present invention, the adhesion of the metal thin-film is high, and thus, a temperature sensor film that has excellent processability, durability, and reliability can be formed.

EXAMPLES

Hereinafter, the present invention will be described in more detail with reference to Examples, but the present invention is not limited to the following Examples.

Example 1

(Preparation of Hard Coat Composition)

Silica particles ("CSZ9281" manufactured by CIK NanoTek Corporation) having an average primary particle diameter of 30 nm were mixed in an amount of 15 parts by weight in terms of solid content with respect to 100 parts by weight of a resin content of an ultraviolet curable urethane acrylate resin ("Aica Aitron Z844-22HL" manufactured by Aica Kogyo Company, Limited) to prepare a hard coat composition using methyl isobutyl ketone as a solvent.

(Production of Film Base with Hard Coat Layer)

The hard coat composition was applied to one surface of a polyethylene terephthalate (PET) film having a thickness of 150 μm ("Lumirror 149UNS" manufactured by Toray Industries, Ra=1.5 nm, Rq=1.9 nm), and drying was performed at 100° C. for 1 minute. Thereafter, a curing treatment was performed by ultraviolet irradiation to form a hard coat layer having a thickness of 1.2 μm. An arithmetic mean roughness Ra and a root mean square roughness Rq of the surface of the hard coat layer were 3.4 nm and 4.4 nm, respectively, and a proportion of an area occupied by nanoparticles in a cross section of the hard coat layer was 16%.

(Formation of Thin-Film)

A roll of a hard coat layer-equipped film base was set in a roll-to-roll sputtering apparatus, inside of the sputtering apparatus was exhausted until a degree of ultimate vacuum reached $5 \times 10^{-3}$ Pa, and then, a silicon thin-film having a thickness of 5 nm, a silicon oxide thin-film having a thickness of 10 nm, and a nickel thin-film having a thickness of 160 nm were sequentially formed on a hard coat layer-formed surface at a substrate temperature of 150° C. by DC sputtering. A B-doped Si target was used to form the Si layer and the $SiO_2$ layer. The Si layer was formed by introducing argon as a sputtering gas under conditions of a pressure of 0.3 Pa and a power density of 1.0 W/cm². The $SiO_2$ layer was formed by introducing oxygen as a reactive gas ($O_2$/Ar=1/1) in addition to argon as a sputtering gas under conditions of a pressure of 0.3 Pa and a power density of 1.8 W/cm². The nickel layer was formed by introducing argon as a sputtering gas using a metal nickel target under conditions of a pressure of 0.3 Pa and a power density of 5.0 W/cm².

Example 2

In preparation of a hard coat composition, silica particles having an average primary particle diameter of 30 nm were added in an amount of 15 parts by weight with respect to 100 parts by weight of a resin content, and crosslinked polymethyl methacrylate particles having an average primary particle diameter of 1.55 μm ("TECHPOLYMER SSX-101" manufactured by Sekisui Kasei Co., Ltd.) were added in an amount of 0.2 parts by weight. A hard coat layer-equipped film base was produced, and a silicon thin-film, a silicon oxide thin-film, and a nickel thin-film were formed on the film base, in the same manner as that of Example 1 except for the above.

Example 3

In preparation of a hard coat composition, 15 parts by weight of aluminum oxide particles ("NanoTek" manufactured by CIK NanoTek Corporation) having an average primary particle diameter of 30 nm were used instead of the silica particles having an average primary particle diameter of 30 nm. In a cross section of the hard coat layer, a proportion of an area occupied by the nanoparticles was 16%. A hard coat layer-equipped film base was produced, and a silicon thin-film, a silicon oxide thin-film, and a nickel thin-film were formed on the film base, in the same manner as that of Example 2 except for the above.

Example 4

In formation of a thin-film, a chromium oxide thin-film having a thickness of 7 nm was formed instead of the silicon thin-film having a thickness of 5 nm, and a stacking configuration of chromium oxide/silicon oxide/nickel was adopted. In formation of the chromium oxide thin-film, a metal Cr target was used, oxygen was introduced as a reactive gas (O$_2$/Ar=1/1) in addition to argon as a sputtering gas, and deposition was performed under conditions of a pressure of 0.3 Pa and a power density of 1.8 W/cm$^2$. A chromium oxide thin-film, a silicon oxide thin-film, and a nickel thin-film were formed on a hard coat layer-equipped film base in the same manner as that of Example 2 except for the above.

Examples 5 to 8 and Comparative Examples 3 and 4

Production of a hard coat layer-equipped film base and formation of a thin-film on the hard coat layer were performed by changing the amount of silica particles and the configuration of the thin-film of the underlying layer as shown in Table 1.

In Comparative Examples 3 and 4 in which the nanoparticles were not contained, the arithmetic mean roughness Ra and the root mean square roughness Rq of the surface of the hard coat layer were 0.3 nm and 0.3 nm, respectively.

In Comparative Example 4 in which the nanoparticles were added in an amount of 7 parts by weight with respect to 100 parts by weight of a resin content, the arithmetic mean roughness Ra and the root mean square roughness Rq of the surface of the hard coat layer were 2.0 nm and 2.2 nm, respectively, and the proportion of the area occupied by the nanoparticles in the cross section of the hard coat layer was 8%.

In Examples 5 and 6 in which the nanoparticles were added in an amount of 25 parts by weight with respect to 100 parts by weight of a resin content, the arithmetic mean roughness Ra and the root mean square roughness Rq of the surface of the hard coat layer were 6.7 nm and 9.2 nm, respectively, and the proportion of the area occupied by the nanoparticles in the cross section of the hard coat layer was 37%.

In Examples 7 and 8 in which the nanoparticles were added in an amount of 40 parts by weight with respect to 100 parts by weight of a resin content, the arithmetic mean roughness Ra and the root mean square roughness Rq of the surface of the hard coat layer were 15.1 nm and 18.9 nm, respectively, and the proportion of the area occupied by the nanoparticles in the cross section of the hard coat layer was 42%.

Comparative Example 1

A nickel thin-film having a thickness of 160 nm was formed on a PET film by DC sputtering without forming a hard coat layer and an underlying layer.

Comparative Example 2

A silicon thin-film, a silicon oxide thin-film, and a nickel thin-film were sequentially formed on a PET film by DC sputtering under the same conditions as those of Example 1 without forming a hard coat layer.

[Evaluation]

The following evaluations were performed on the hard coat layer-equipped film base and the electroconductive films produced in Examples and Comparative Examples.

<Amount of Nanoparticles in Cross Section of Hard Coat Layer>

SEM observation of the cross section of the hard coat layer-equipped film base was performed, and an image obtained by binarizing the observation image was analyzed to determine a proportion of an area occupied by the nanoparticles (silica particles having an average primary particle diameter of 30 nm).

<Surface Shape>

A three-dimensional surface shape was measured under the following conditions using an atomic force microscope ("Dimension3100" manufactured by Bruker Corporation), a roughness curve having a length of 1 μm was derived, and an arithmetic mean roughness Ra and a root mean square roughness Rq were calculated in accordance with JIS B0601.

Controller: Nanoscope V
Measurement mode: tapping mode
Cantilever: Si single crystal
Measurement visual field: 1 μm×1 μm <Temperature Coefficient of Resistance>

(Preparation of Measurement Sample)

The electroconductive film was cut into a size of 10 mm×200 mm, the nickel layer was patterned into a stripe shape having a wiring width of 30 μm by laser patterning to form a thermometric resistor part having the shape illustrated in FIG. 3A. At the time of patterning, the length of the pattern was adjusted such that the total wiring resistance was about 10 kΩ and the resistance of the thermometric resistor part was 30 times the resistance of the lead part, thereby preparing a measurement sample (temperature sensor film).

(Measurement of Temperature Coefficient of Resistance)

In a small heating and cooling oven, the thermometric resistor part of the temperature sensor film was set to 5° C., 25° C., and 45° C. One tip and the other tip of the lead part were connected to a tester, a constant current was applied, and a voltage was read to measure a two-terminal resistance at each temperature. An average value of the TCR calculated from the resistance values at 5° C. and 25° C. and the TCR calculated from the resistance values at 25° C. and 45° C. was defined as a TCR of the nickel layer.

(Measurement of Temperature Coefficient of Resistance of Electroconductive Film after Heat Treatment)

After the electroconductive film was heated in a hot air oven at 155° C. for 1 hour, a temperature sensor film was produced in the same procedure as described above, and a TCR of the nickel layer was measured.

<Adhesion>

The following evaluations were performed on each of the untreated sample (initial) after the thin-deposition, the sample after subjected to the heating durability test in a hot air oven at 80° C. for 500 hours (after the heat test), and the sample after subjected to the high temperature and high humidity durability test in a constant temperature and humidity chamber at a temperature of 65° C. and a relative humidity of 90% for 500 hours (after the high temperature and high humidity test).

On the nickel thin-film-formed surface of the electroconductive film, using a cutter knife, cuts were made to form grids of 100 squares at intervals of 1 mm in each of vertical and horizontal directions. A peeling test was performed according to a grid test of former JIS-K5400, and the number of grids from which the thin-film was peeled off was counted in the region of ¼ or more of the area of the grids. The smaller the number, the higher the adhesion.

<Bending Resistance>

A cylindrical mandrel test was performed using a type 1 tester according to JIS K5600-5-1:1999. Both the tests of bending the Ni layer-formed surface of the sample as an inner side (imparting a compressive strain to the Ni layer) and bending the Ni layer-formed surface of the sample as an outer side (imparting a tensile strain to the Ni layer) were performed. In each test, the diameter of the mandrel was sequentially reduced, and the diameter of the mandrel in which a crack occurred for the first time in the Ni layer was recorded. The smaller the diameter of the mandrel, the better the bending resistance.

<Scratch Resistance>

Steel wool ("Bonstar #0000" manufactured by NIHON STEEL WOOL Co., Ltd.) was fixed to a flat surface of a cylindrical jig of 10 mmφ, a scratch test was performed 10 reciprocations at a load of 50 g/cm$^2$, a sliding interval of 100 mm, and a sliding speed of 100 mm/sec by a wear tester, the presence or absence of scratches on the surface of the nickel thin-film after the test was visually observed, and evaluations were performed according to the following criteria.

Good: The number of scratches was 14 or less
Fair: The number of scratches was 15 to 50
Poor: The number of scratches was 51 or more <Blocking Resistance>

A film having a smooth surface ("ZEONOR film ZF-16" manufactured by Zeon Corporation) was press-bonded to the Ni thin-film-formed surface of the electroconductive film by finger pressure, and the state of blocking between the films was visually observed and evaluated according to the following criteria.

Good: Blocking was not generated immediately after the press-bonding
Fair: Blocking was generated immediately after the press-bonding, but the blocking was eliminated over time
Poor: Blocking was generated immediately after the press-bonding, and the blocking was not eliminated over time The configurations of the electroconductive films (the content of the fine particles in the hard coat layer and the configuration of the underlying layer) and the evaluation results of the electroconductive films (the surface roughness, the temperature coefficient of resistance, the adhesion, the bending resistance, the scratch resistance, and the blocking resistance) of Examples and Comparative Examples are shown in Table 1.

TABLE 1

| | Electroconductive film configuration | | | | Evaluation results | | | | | Adhesion | | Bending resistance (mm) | | | |
|---|---|---|---|---|---|---|---|---|---|---|---|---|---|---|---|
| | Fine particles in HC layer (parts by weight) | | | Underlying layer configuration | Surface roughness | | TCR (ppm/°C.) | | | After high temperature and high humidity test | | | | Scratch resistance | Blocking resistance |
| | 30 nm SiO$_2$ | 30 nm Al$_2$O$_3$ | 1.5 mm Acryl | | Ra (nm) | Rq (nm) | Initial | 155°C. 1 hr | Initial | After heat test | | Compression | Tension | | |
| Example 1 | 15 | — | — | Si/SiO$_2$ | 2.6 | 3.9 | 3932 | 4438 | 0 | 0 | 3 | 6 | 8 | Good | Fair |
| Example 2 | 15 | — | 0.2 | Si/SiO$_2$ | 2.8 | 4.1 | 3988 | 4441 | 0 | 0 | 4 | 6 | 8 | Good | Good |
| Example 3 | — | 15 | 0.2 | Si/SiO$_2$ | 3.4 | 4.3 | 3959 | 4478 | 0 | 0 | 0 | 6 | 4 | Good | Good |
| Example 4 | 15 | — | 0.2 | CrO/SiO$_2$ | 4.0 | 6.3 | 3933 | 4342 | 0 | 0 | 11 | 8 | 8 | Good | Good |
| Example 5 | 25 | — | 0.2 | Si/SiO$_2$ | 7.0 | 8.9 | 3931 | 4277 | 0 | 0 | 0 | 6 | 6 | Good | Good |
| Example 6 | 25 | — | 0.2 | CrO/SiO$_2$ | 11.3 | 13.6 | 3936 | 4191 | 0 | 0 | 0 | 8 | 6 | Good | Good |
| Example 7 | 40 | — | 0.2 | Si/SiO$_2$ | 18.6 | 28.9 | 3884 | 4119 | 0 | 0 | 0 | 8 | 4 | Good | Good |
| Example 8 | 40 | — | 0.2 | CrO/SiO$_2$ | 14.1 | 18.0 | 3783 | 3983 | 0 | 0 | 0 | 8 | 4 | Good | Good |
| Comparative Example 1 | Absence of HC | | | — | 1.8 | 2.4 | 3651 | 3628 | 0 | 0 | 0 | 8 | 12 | Poor | Fair |
| Comparative Example 2 | Absence of HC | | | Si/SiO$_2$ | 2.0 | 2.2 | 3938 | 4400 | 0 | 0 | 0 | 6 | 10 | Poor | Fair |
| Comparative Example 3 | — | — | 0.2 | Si/SiO$_2$ | 1.3 | 1.6 | 4054 | 4612 | 0 | 33 | 100 | 6 | 12 | Good | Good |
| Comparative Example 4 | 7 | — | 0.2 | Si/SiO$_2$ | 2.1 | 2.4 | 3968 | 4448 | 0 | 3 | 25 | 6 | 10 | Good | Good |

In Comparative Example 1 in which the nickel thin-film was directly formed on the PET film, the bending resistance and the scratch resistance against the tensile bending were deteriorated, and the blocking resistance was not sufficient. In addition, in the electroconductive film of Comparative Example 1, the initial TCR was lower than those of other examples, and the TCR was not increased even after heating.

In Comparative Example 2 in which the silicon thin-film and the silicon oxide thin-film were formed on the PET film as an underlying layer and the nickel thin-film was formed on the underlying layer, the TCR was increased as compared with Comparative Example 1, but the bending resistance, the scratch resistance, and the blocking resistance were the same as those in Comparative Example 1.

In Comparative Example 3 in which the hard coat layer containing the microparticles was formed on the PET film and the underlying layer and the nickel thin-film were formed on the hard coat layer, the surface roughnesses Ra and. Rq of the nickel thin-film were decreased as compared to those in Comparative Examples 1 and 2. This is considered to be because the hard coat layer was formed by wet coating, such that surface irregularities of the PET film were filled and smoothed, and the surface roughness of the thin-film provided on the PET film was reduced.

In Comparative Example 3 in which the hard coat layer containing microparticles and nanoparticles was uncontained, the scratch resistance and the blocking resistance were improved and the TCR was increased as compared with Comparative Examples 1 and 2. However, in Comparative Example 3, the adhesion of the sample after the heat test (80° C., 500 hours) and after high temperature and high humidity test (65° C. and 90% RH, 500 hours) was significantly deteriorated.

In Comparative Example 4 in which 7 parts by weight of the nanoparticles and 0.2 parts by weight of the microparticles were added to the hard coat layer (proportion of the nanoparticles in the cross section of the hard coat layer: 8%), the adhesion was improved as compared with Comparative Example 3, but the adhesion after the high temperature and high humidity test was not sufficient. In addition, in Comparative Example 4, no clear improvement in bending resistance was observed.

In each of Examples 1 to 8 in which the amount of nanoparticles was larger than that in Comparative Example 4, the adhesion of the sample after the heat test and after the high temperature and high humidity test was excellent, and the bending resistance was also improved. From the comparison between Examples 1 and 2, it can be seen that the blocking resistance is improved by blending a small amount of microparticles in addition to nanoparticles.

In Comparative Example 4 and Examples 1 to 8, the surface roughnesses Ra and Rq tended to be increased as the amount of nanoparticles in the hard coat layer was larger, and thus, the adhesion and the bending resistance tended to be improved. In contrast, in all Examples, although the TCR tended to be decreased as the amount of nanoparticles was larger, it was shown that the TCR was higher than that in Comparative Example 1 in Which the underlying layer was not included.

From the comparison between the above Examples and Comparative Examples, it can be seen that a hard coat layer containing a specific amount of nanoparticles is formed on a resin film and a metal thin-film is formed on the hard coat layer with an underlying layer interposed therebetween, such that an electroconductive film in which the metal thin-film has excellent scratch resistance, bending resistance, and adhesion and has a high TCR is obtained.

DESCRIPTION OF REFERENCE SIGNS 50 resin film base
5 resin film
6 hard coat layer
20 underlying layer
10 metal thin-film
11 lead part
12 thermometric resistor part
122, 123 sensor wiring
19 connector
102 electroconductive film
110 temperature sensor film

The invention claimed is:

1. An electroconductive film for a temperature sensor, the electroconductive film comprising: a resin film base having a hard coat layer disposed on a surface of a resin film; an underlying layer disposed on a hard coat layer-formed surface of the resin film base; and a metal thin-film disposed on the underlying layer, wherein
the underlying layer includes at least one layer of an inorganic dielectric thin-film,
the hard coat layer contains first fine particles having an average primary particle diameter of 10 to 100 nm, and
in a cross section of the hard coat layer, a proportion of an area occupied by the first fine particles is 10% or more.

2. The electroconductive film according to claim 1, wherein an arithmetic mean roughness of the metal thin-film is 2 to 25 nm or more, wherein the arithmetic mean roughness is determined from a roughness curve having a length of 1 μm.

3. The electroconductive film according to claim 1, wherein a root mean square roughness of the metal thin-film is 2.5 to 40 nm or less, wherein the root mean square roughness is determined from a roughness curve having a length of 1 μm.

4. The electroconductive film according to claim 1, wherein the hard coat layer contains second fine particles having an average primary particle diameter of 0.5 to 3.5 μm.

5. The electroconductive film according to claim 4, wherein a thickness of the hard coat layer is 0.5 to 1 time the average primary particle diameter of the second fine particles.

6. The electroconductive film according to claim 1, wherein the underlying layer includes at least one layer of silicon-based thin-film.

7. The electroconductive film according to claim 1, wherein a thickness of the metal thin-film is 20 to 500 nm.

8. The electroconductive film according to claim 1, wherein the metal thin-film is formed of nickel or a nickel alloy.

9. The electroconductive film according to claim 1, having a temperature coefficient of resistance of 3,000 ppm/° C. or more.

10. A method for producing the electroconductive film set forth in claim 1, the method comprising depositing the metal thin-film by a sputtering method.

11. A temperature sensor film comprising:
a resin film base having a hard coat layer disposed on a surface of a resin film;
an underlying layer disposed on a hard coat layer-formed surface of the resin film base; and
a patterned metal thin-film disposed on the underlying layer, wherein
the metal thin-film is patterned to have a thermometric resistor part and a lead part, wherein the thermometric resistor part is patterned into a thin wire and is used for measuring a temperature, and the lead part is connected to the thermometric resistor part and is patterned to have a larger wiring width than that of the thermometric resistor part, the underlying layer includes at least one layer of inorganic dielectric thin-film, the hard coat layer contains first fine particles having an average primary particle diameter of 10 to 100 nm, and in a cross section of the hard coat layer, a proportion of an area occupied by the first fine particles is 10% or more.

* * * * *